(12) United States Patent
Caffee et al.

(10) Patent No.: US 9,007,119 B2
(45) Date of Patent: *Apr. 14, 2015

(54) INTEGRATED MEMS DESIGN FOR MANUFACTURING

(71) Applicant: Silicon Laboratories Inc., Austin, TX (US)

(72) Inventors: Aaron J. Caffee, Scappoose, OR (US); Brian G. Drost, Corvallis, OR (US); Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/137,499

(22) Filed: Dec. 20, 2013

(65) Prior Publication Data

US 2014/0306623 A1    Oct. 16, 2014

Related U.S. Application Data

(63) Continuation-in-part of application No. 13/786,686, filed on Mar. 6, 2013.

(51) Int. Cl.
*H01L 41/00* (2013.01)
*H02N 1/00* (2006.01)
*B81B 7/00* (2006.01)

(52) U.S. Cl.
CPC .............. *H02N 1/006* (2013.01); *B81B 7/0045* (2013.01)

(58) Field of Classification Search
USPC ............................................ 327/50, 57, 516
See application file for complete search history.

(56) References Cited

U.S. PATENT DOCUMENTS

| | | | |
|---|---|---|---|
| 6,954,020 B2 * | 10/2005 | Ma et al. | 310/309 |
| 7,854,174 B2 * | 12/2010 | Aebersold et al. | 73/780 |
| 7,982,550 B1 * | 7/2011 | Quevy et al. | 331/176 |
| 2007/0247245 A1 | 10/2007 | Hagelin | |
| 2007/0290763 A1 | 12/2007 | Partridge et al. | |
| 2008/0007362 A1 | 1/2008 | Partridge et al. | |
| 2009/0121808 A1 | 5/2009 | Van Beek et al. | |
| 2010/0225483 A1 | 9/2010 | Scheucher et al. | |

(Continued)

OTHER PUBLICATIONS

Kaajakari, Ville, "MEMS Tutorial: Nonlinearity in Micromechanical Resonators," URL: <http://www.kaajakari.net/~ville/research/tutorials/tutorials.shtml>, downloaded Jan. 25, 2013, 7 pages.

Kaajakari, Ville, "Reference Oscillators," Section 21.2 of Practical MEMS, Small Gear Publishing, 2009, pp. 334-339.

(Continued)

*Primary Examiner* — Brandon S Cole
(74) *Attorney, Agent, or Firm* — Abel Law Group, LLP

(57) ABSTRACT

A method of operating a system including a MEMS device of an integrated circuit die includes generating an indicator of a device parameter of the MEMS device in a first mode of operating the system using a monitor structure formed using a MEMS structural layer of the integrated circuit die. The method includes generating, using a CMOS device of the integrated circuit die, a signal indicative of the device parameter and based on the indicator. The device parameter may be a geometric dimension of the MEMS device. The method may include, in a second mode of operating the system, compensating for a difference between a value of the signal and a target value of the signal. The method may include re-generating the indicator after exposing the MEMS device to stress and generating a second signal indicating a change in the device parameter.

21 Claims, 12 Drawing Sheets

(56) References Cited

U.S. PATENT DOCUMENTS

| | | |
|---|---|---|
| 2011/0057709 A1 | 3/2011 | Laraia et al. |
| 2012/0043999 A1 | 2/2012 | Quevy et al. |
| 2012/0133448 A1 | 5/2012 | Gregg et al. |
| 2012/0133848 A1 | 5/2012 | Williamson |
| 2012/0268216 A1 | 10/2012 | Borremans |
| 2012/0274410 A1 | 11/2012 | Koyama |
| 2013/0106497 A1 | 5/2013 | Lutz et al. |

OTHER PUBLICATIONS

U.S. Appl. No. 13/721,642 entitled "MEMS Mass Bias to Track Changes in Bias Conditions and Reduce Effects of Flicker Noise," filed Dec. 20, 2013, naming Manu Seth and Aaron Caffee as inventors.

Perrott, Michael H. et al., "A Temperature-to-Digital Converter for a MEMS-Based Programmable Oscillator With < ±0.5-ppm Frequency Stability and < 1-ps Integrated Jitter," IEEE Journal of Solid-State Circuits, vol. 48, No. 1, Jan. 2013, pp. 276-291.

* cited by examiner

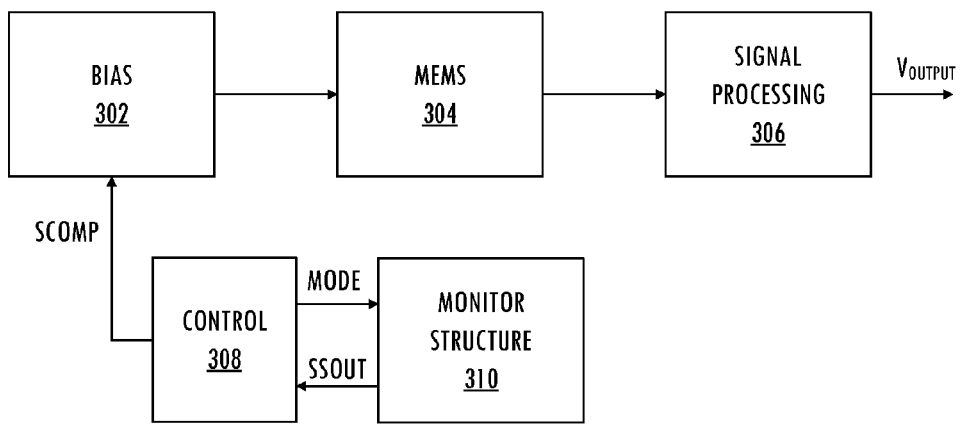
FIG. 8
FIG. 9
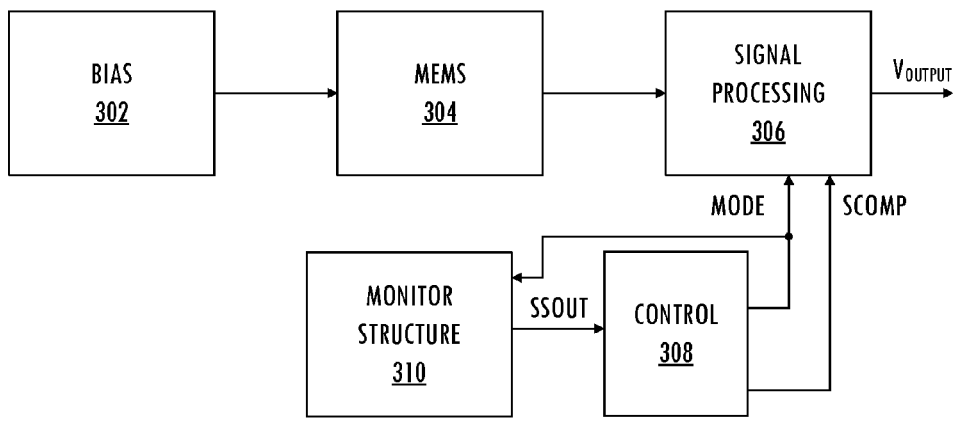
FIG. 10

INTEGRATED MEMS DESIGN FOR MANUFACTURING

CROSS-REFERENCE TO RELATED APPLICATION(S)

This application is a continuation-in-part of co-pending application Ser. No. 13/786,686, filed Mar. 6, 2013, entitled "Compensation of Changes in MEMS Capacitive Transduction" naming Aaron Caffee and Emmanuel P. Quevy as inventors, which application is hereby incorporated by reference.

BACKGROUND

1. Field of the Invention

The invention is related to microelectromechanical systems (MEMS) devices.

2. Description of the Related Art

In general, microelectromechanical systems (MEMS) devices include very small mechanical elements. The mechanical element is typically capable of some form of mechanical motion and is formed at the micro-scale using fabrication techniques similar to those utilized in the microelectronics industry, such as using lithography, deposition, and etching processes. A MEMS transducer including the mechanical element converts energy between different forms, e.g., electrostatic and mechanical forms. MEMS transducers may be used as both sensors that convert motion into electrical energy (accelerometers, pressure sensors, etc.) and actuators that convert electrical signals to motion (comb drive, micromirror devices, resonators). MEMS devices using capacitive transducers are easy to manufacture and result in low noise and low power consumption sensors and/or actuators.

Typically, a mechanical element of a MEMS device has a geometry that varies with variations in manufacturing process. Abnormalities and defects in these mechanical elements due to variations in manufacturing process may be difficult to detect in the manufactured device. Accordingly, new techniques for monitoring the quality of manufactured MEMS devices are desired.

SUMMARY OF EMBODIMENTS OF THE INVENTION

In at least one embodiment of the invention, a method of operating a system including a MEMS device of an integrated circuit die includes generating an indicator of a device parameter of the MEMS device in a first mode of operating the system using a monitor structure formed using a MEMS structural layer of the integrated circuit die. The method includes generating, using a complementary metal-oxide semiconductor (CMOS) device of the integrated circuit die, a signal indicative of the device parameter and based on the indicator. The device parameter may be a geometric dimension of the MEMS device. The method may include, in a second mode of operating the system, compensating for a difference between a value of the signal and a target value of the signal. The method may include re-generating the indicator after exposing the MEMS device to stress and generating a second signal indicating a change in the device parameter. The method may include rejecting the integrated circuit die in response to the signal indicating the parameter falls outside of a predetermined range for the device parameter. The method may include receiving a control value based on the signal and operating the system in a second mode of operation based on the control signal. The method may include communicating the signal externally from the integrated circuit die, wherein the control value is received by the integrated circuit die from an external circuit. The method may include communicating the signal to a control circuit formed using CMOS layers of the integrated circuit die, generating the control value by the control circuit, and receiving the control value from the control circuit.

In at least one embodiment of the invention, an integrated circuit die includes a microelectromechanical system (MEMS) device formed using a MEMS structural layer of the integrated circuit die. The integrated circuit die includes a monitor structure configured to generate an indicator of a device parameter of the MEMS device. The integrated circuit die includes a complementary metal-oxide semiconductor (CMOS) circuit configured to generate a signal indicative of the device parameter based on the indicator. The signal may be generated in a first mode of operation of the integrated circuit. The monitor structure may be formed using the MEMS structural layer. The integrated circuit die may include a control circuit configured to provide a compensating signal to the MEMS device based on the signal in a second mode of operation of the integrated circuit. The monitor structure may include a capacitor or resistor formed using the MEMS structural layer. The monitor structure may include a partitioned electrode of the MEMS device. The monitor structure may include an auxiliary MEMS device.

In at least one embodiment of the invention, a method of manufacturing an apparatus includes forming a MEMS device using a MEMS structural layer of the integrated circuit die. The method includes forming a monitor structure using the MEMS structural layer of the integrated circuit die. The monitor structure is configured to generate an indicator of a device parameter of the MEMS device. The method includes forming a CMOS circuit configured to generate a signal indicative of the device parameter in a first mode of operation of the integrated circuit.

BRIEF DESCRIPTION OF THE DRAWINGS

The present invention may be better understood, and its numerous objects, features, and advantages made apparent to those skilled in the art by referencing the accompanying drawings.

FIG. 8 illustrates a functional block diagram of a MEMS system including a MEMS device and associated circuitry.

FIG. 9 illustrates a functional block diagram of a MEMS system configured for indirect parameter sensing and compensation using a bias signal of the MEMS device consistent with at least one embodiment of the invention.

FIG. 10 illustrates a functional block diagram of a MEMS system configured for indirect parameter sensing and compensation using signal processing of an output of the MEMS device consistent with at least one embodiment of the invention.

The use of the same reference symbols in different drawings indicates similar or identical items.

DETAILED DESCRIPTION

Figure 1:
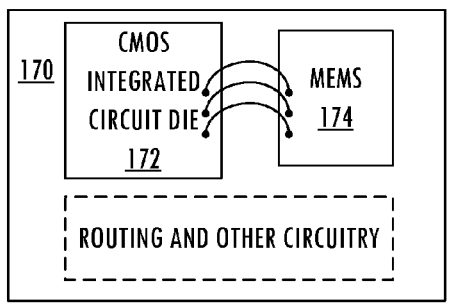
FIG. 1 illustrates a multi-chip module including a MEMS die and a CMOS die.

Referring to FIG. 1, an exemplary MEMS system is formed using substrate 170, which provides support and routing for a multi-chip module including CMOS integrated circuit 172 and MEMS device 174, each formed using a separate die. Substrate 170 also includes routing and other circuitry that facilitate communication between CMOS integrated circuit 172, MEMS device 174, and other circuitry. Techniques for monitoring the manufacturing process of MEMS device 174 include forming process control monitors at one or more location on a wafer including multiple MEMS devices 174. Those process control monitors may be evaluated during probe and/or manufacturing test prior to dicing the wafer into individual die, each including an instantiation of MEMS device 174. Although this technique provides some information regarding the actual manufacturing process, the information is limited with regard to any particular MEMS device 174. Techniques for interacting with a MEMS device after being diced into individual die include wire-bonding CMOS integrated circuit 172 to MEMS device 174 or other techniques for communicating between individual die of a multi-chip module. However, such techniques are limited by the number of input/output ports of MEMS device 174 and sensitivity of those signals may be impacted by the characteristics of the communications interface between CMOS integrated circuit 172, MEMS device 174, and external evaluation equipment.

A technique for monitoring a MEMS manufacturing process includes co-fabrication of the MEMS device and the CMOS integrated circuit using the same substrate. An individual die includes a process control monitor structure formed using one or more of the layers formed using a corresponding substrate. The CMOS integrated circuit layers include a circuit for processing an indicator generated by the process control monitor of the die to generate a signal indicative of a MEMS device parameter, which may be provided external to the die for further processing. Exemplary MEMS device parameters include geometrical parameters including thickness, curling, gap, etc. and mechanical parameters including Young's modulus, material density, yield strength, cavity partial pressure, strain, or other suitable device parameter.

In general, co-fabrication of MEMS devices with integrated circuits achieves higher performance systems at lower cost. The use of materials for structural and sacrificial layers (e.g., poly-silicon-germanium and poly-germanium) that have a sufficiently low thermal budget (e.g., can be processed using steps at temperatures below 450 degrees Celsius) will not affect the integrated circuits and allows the fabrication of MEMS by surface micromachining after the completion of an integrated circuit process, such as complementary metal oxide semiconductor (CMOS). Encapsulation of the MEMS is feasible using any of a variety of technologies (e.g., die-level packaging or wafer-level packaging using bulk wafer caps, micro-assembled caps, in situ caps, or other suitable techniques). An exemplary resulting device is encapsulated by a microcap with a cavity containing the MEMS.

Figure 2A:
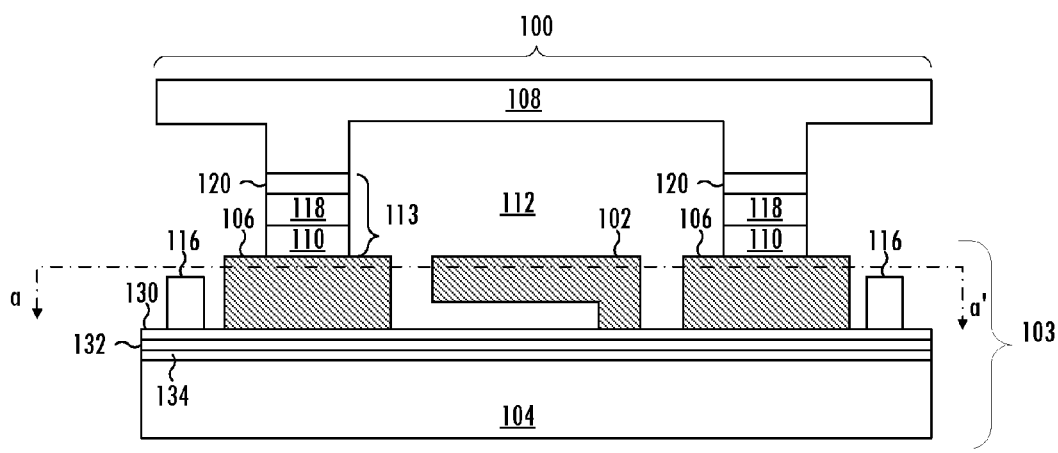
FIG. 2A illustrates a cross-sectional view of an exemplary encapsulated MEMS device.
Figure 2B:
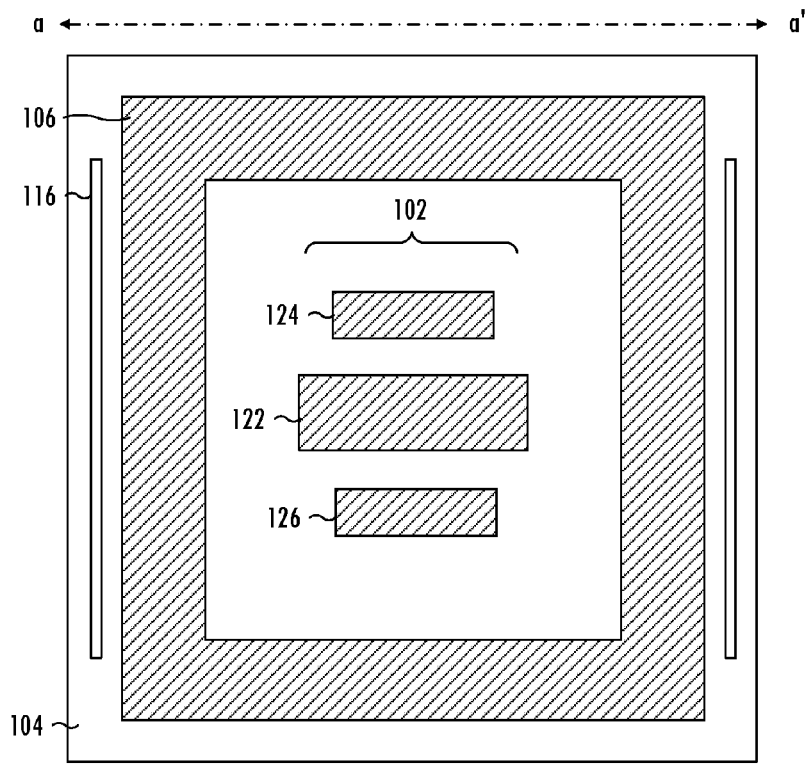
FIG. 2B illustrates a plan view of the exemplary encapsulated MEMS device of FIG. 2A.

Referring to FIGS. 2A and 2B, exemplary microelectromechanical system structure 100 includes integrated circuit die 103, which includes MEMS device 102 formed using substrate 104. Substrate 104 includes a CMOS integrated circuit. MEMS device 102 may be any device that falls within the scope of MEMS technologies. For example, MEMS device 102 may be any mechanical and electronic structure fabricated above a substrate using lithography, deposition, and etching processes. MEMS device 102 may be a device such as, but not limited to, a resonator (e.g., an oscillator), a temperature sensor, a pressure sensor or an inertial sensor (e.g., an accelerometer or a gyroscope). MEMS device 102 may have a portion suspended from substrate 104. In at least one embodiment, the suspended portion of MEMS device 102 is a suspended feature having a resonant frequency. For example, the suspended portion of MEMS device 102 is a feature such as, but not limited to, a beam, a plate, a cantilever arm, or a tuning fork. In at least one embodiment, MEMS device 102 includes a resonating feature 122 flanked by a driver electrode 124 and a sensor electrode 126, as depicted in FIG. 2B.

Substrate 104 may be composed of any material suitable to withstand an integrated circuit fabrication process and a MEMS fabrication process and to provide structural integrity for a MEMS structure having a suspended portion. In an embodiment, substrate 104 is composed of group IV-based materials such as, but not limited to, crystalline silicon, germanium or silicon-germanium. In another embodiment, substrate 104 is composed of a III-V material. Substrate 104 may also include an insulating layer. The insulating layer may be composed of a material such as, but not limited to, silicon dioxide, silicon nitride, silicon oxy-nitride or a high-k or a low-k dielectric layer that may be formed by a typical CMOS manufacturing process. Substrate 104 may be composed of an insulator material. In at least one embodiment, substrate 104 is composed of a material such as, but not limited to, glass, quartz or sapphire.

Substrate 104 incorporates an integrated circuit. For example, in accordance with an embodiment of the present invention, substrate 104 includes a plurality of interconnect structures connecting a plurality of micro-electronic devices, both of which are disposed underneath MEMS device 102. In at least one embodiment, the plurality of micro-electronic devices includes a plurality of N-type and P-type transistors and the plurality of interconnect structures includes a plurality of conductive interconnects that couple the plurality of N-type and P-type transistors into an integrated circuit. Substrate 104 may further include conductive electrodes that contact underlying interconnect structures. For example, in at least one embodiment, substrate 104 includes a plug or via (not shown) in contact with contact pads 116.

MEMS device 102 may be formed from a material suitable to withstand a MEMS fabrication process. For example, in at least one embodiment, MEMS device 102 is composed of a material such as, but not limited to, a semiconductor, an insulator, or a conductor. In at least one embodiment, MEMS device 102 is composed of a semiconductor material such as, but not limited to, silicon, germanium, silicon-germanium, carbon-doped silicon, carbon-doped silicon-germanium, or a III-V material. The semiconductor material may also be composed of dopant impurity atoms. For example, MEMS device 102 is composed of polycrystalline silicon-germanium with a germanium atomic concentration approximately in the range of 50-70% and boron dopant impurity atoms with a total atomic concentration approximately in the range of $1 \times 10^{18} \sim 5 \times 10^{20}$ atoms/cm$^3$. Furthermore, MEMS device 102 may be composed of a semiconductor material that is formed by a relatively low temperature process (e.g., a semiconductor material formed at a temperature less than approximately 450° C.). MEMS device 102 may be composed of an insulating material such as, but not limited to, silicon dioxide, silicon nitride, silicon oxy-nitride or a high-k or low-k dielectric material. In at least one other embodiment, MEMS device 102 is composed of a conductor and is formed from a material such as, but not limited to, copper, aluminum, a metal alloy or a metal silicide.

MEMS device 102 is formed on substrate 104, above the integrated circuit structures. Those integrated circuit structures include conducting portions (e.g., metal structures formed from copper, aluminum, and/or other conducting materials). Those conducting portions are protected with one or more passivation layers, which are typically glass layers (e.g., oxide or nitride with thicknesses on the order of 50 Å), to protect the circuitry from mechanical abrasion during later manufacturing procedures (e.g., probe, packaging, etc.) and to provide a barrier to contaminants (e.g., H$_2$O, ionic salts) that may damage circuitry. For example, CMOS structures formed using substrate 104 are protected using a stack of passivation layers 130, 132, and 134 (e.g., silicon-rich oxide, silicon nitride, and a cap oxide, respectively). The passivation stack serves to protect the CMOS circuitry from subsequent techniques for manufacturing MEMS device 102 and associated structures. Techniques for forming MEMS device 102 and associated structures using a substrate including an integrated circuit device are described in U.S. patent application Ser. No. 13/075,800, filed Mar. 30, 2011, entitled "Technique for Forming a MEMS Device," naming Emmanuel P. Quevy, Carrie W. Low, Jeremy Ryan Hui, and Zhen Gu as inventors, and U.S. patent application Ser. No. 13/075,806, filed Mar. 30, 2011, entitled "Technique for Forming a MEMS Device Using Island Structures," naming Emmanuel P. Quevy and Carrie W. Low as inventors, which applications are hereby incorporated by reference.

Still referring to FIG. 2A, the resulting MEMS device 102 may be encapsulated. For example, a silicon-germanium seal ring 106 disposed on substrate 104 attaches a second substrate to substrate 104 to form sealed cavity 112. Metal seal ring 110 is disposed on cap substrate 108. Metal seal ring 110 is aligned with and bonded to silicon-germanium seal ring 106 to provide sealed cavity 112. Sealed cavity 112 houses MEMS device 102, as depicted in FIG. 2A. Contact pads 116 may be included on substrate 104, on the outside of sealed cavity 112. Metal seal ring 110 may be included in a metal seal ring stack 113 including a seed layer 118 and a dielectric layer 120, as depicted in FIG. 2A. Any suitable encapsulation technique may be used, e.g., die-level packaging or wafer-level packaging using bulk wafer caps, micro-assembled caps, in situ caps, or other suitable encapsulation techniques.

Parameters of a MEMS device may vary as a function of variations in the manufacturing process alone or in combination with environmental factors (e.g., temperature, humidity, strain, aging, etc.) that cause variation in behavior of the MEMS device, thereby changing the resonant frequency or other operational characteristics of the MEMS device. For example, the resonant frequency of a MEMS device using capacitive transduction is based on the geometry of capacitive transducers (e.g., dimensions of a gap between capacitive plates). The geometry of the capacitive transducers may vary with variations in manufacturing process (e.g., layer thickness variation, photolithography line width variations, electrode growth rate and dwell time, released material curling due to strain gradient, etc.) In addition, soldering the substrate to a second substrate (e.g., a printed circuit board) causes stress on the substrate of the MEMS device. Stress on a substrate of a MEMS device causes strain on the MEMS device. Strain can change over time, resulting in a perceived aging of the part. In addition, strain can change over temperature, resulting in a perceived temperature instability. In sensor applications of MEMS devices (e.g., inertial sensors or pressure sensors), strain instability can cause offset variation over time, which affects the achievable resolution of a sensor.

Figure 3A:
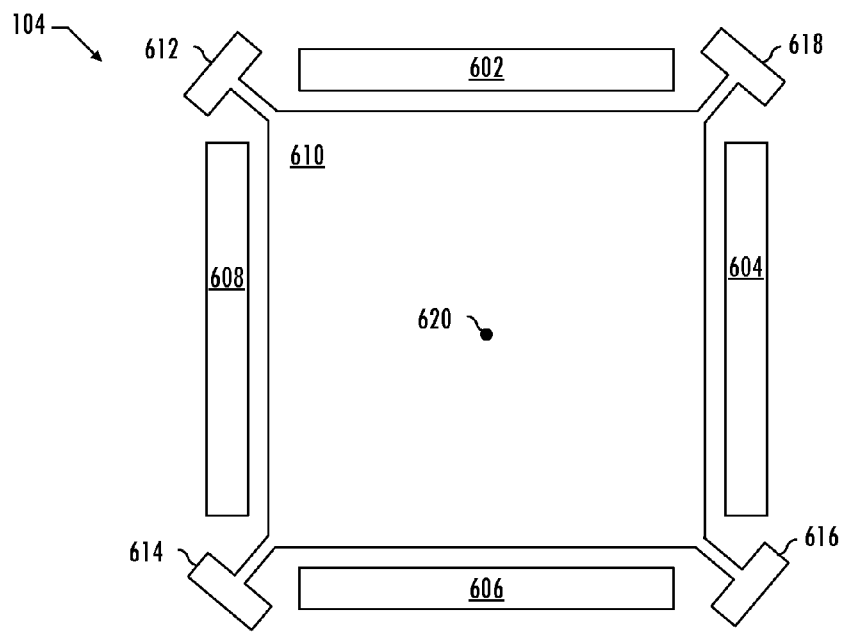
FIG. 3A illustrates a plan view of an exemplary MEMS device.
Figure 3B:
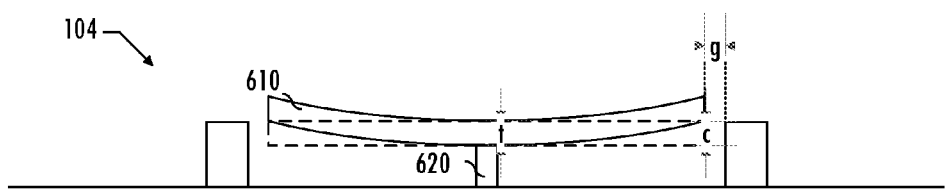
FIG. 3B illustrates a cross-sectional view of the exemplary MEMS device of FIG. 3A.

Referring to FIGS. 3A and 3B, an exemplary MEMS device 304 includes a first electrode formed from electrode portion 608 and electrode portion 604. A second electrode is formed from electrode portion 602 and electrode portion 606. Resonator 610 (i.e., mass 610 or body 610) is capacitively coupled to the first and second electrodes. In at least one embodiment of MEMS device 304, electrode portions 602 and 606 are electrically coupled to each other (e.g., in another integrated circuit layer of the device, not shown) and electrode portions 604 and 608 are electrically coupled to each other. In the exemplary MEMS device, electrode portions 602, 604, 606, and 608 are attached to the substrate by anchors. Resonator 610 includes central anchor 620 and anchors 612, 614, 616, and 618. The device parameters, transduction gap, g, thickness, t, and strain displacement, c, due to curvature of the surface of resonator 610, may all vary in response to manufacturing process variation.

Figure 4:
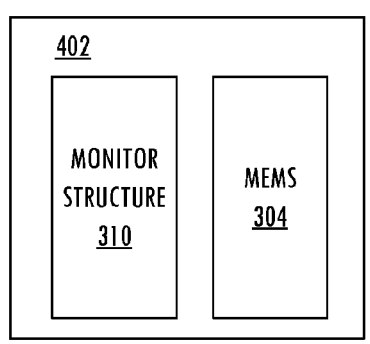
FIG. 4 illustrates a functional block diagram of an integrated circuit die including a MEMS monitor structure and MEMS device consistent with at least one embodiment of the invention.

Referring to FIG. 4, a technique for characterizing the device parameters includes forming a monitor structure 310 on the substrate including MEMS device 304. In at least one embodiment, monitor structure 310 is formed using a MEMS structural layer. However, monitor structure 310 may be formed using conductive layers of the CMOS process or a combination of a MEMS structural layer and other integrated circuit layers formed on substrate 402. As referred to herein, a structural layer is a layer of a particular material that is later patterned and at least partially released to form at least a portion that is free to mechanically move or be deflected in at least one direction with respect to a surface of a substrate. As referred to herein, a release of a structure or a portion of a structural layer frees that structure or portion of the structural layer to have a portion that is free to mechanically move or be deflected in at least one directional plane with respect to the substrate. A release layer is a layer of material that, when removed, releases at least a portion of the structure or structural layer. The release typically occurs towards the end of manufacture to maintain integrity of the released structures. Monitor structure 310 may include a capacitor or resistor formed using the MEMS structural layer. Monitor structure 310 may include an auxiliary MEMS device that duplicates the device features of MEMS device 304, but is configured only for indirect characterization of device features (described further below), while MEMS 304 is configured for a target application. The auxiliary MEMS device may be used to infer the device features of MEMS device 304 based on indicators provided by the auxiliary MEMS device.

In at least one embodiment, MEMS device 304 is configured for an in-plane resonant mode of operation, i.e., the resonator is driven to resonate in a mode where the resonator 610 is deformed in a direction parallel to the largest linear dimensions of the resonator and the resonator remains in the plane of the electrode, which is typically lateral (i.e., parallel or horizontally) with respect to a horizontal substrate 104. In contrast, an out-of-plane resonant mode causes deformation in a direction orthogonal to the largest linear dimensions of the resonator. For example, where the largest linear dimensions are in directions across a substrate surface, out-of-plane resonation is in the vertical direction with respect to a horizontal surface of the substrate. An in-plane resonant mode may be preferable for some MEMS implementations since in-plane resonation reduces interactions of the resonating element with any gas in the cavity of an encapsulated MEMS device. However, to increase sensitivity of the MEMS device to gas in a cavity and gain insight into whether the gas levels are within a target range, monitor structure 310 includes an auxiliary MEMS device that may be configured for an out-of-plane resonant mode and/or may have a different device geometry that increases the sensitivity of the MEMS resonant mode to gas in the cavity.

In at least one embodiment, rather than using a monitor structure 310 that is separate from MEMS device 304, monitor structure 310 is formed as part of MEMS device 304 and configured to generate an indicator of a device feature based on the actual device features of MEMS device 304. For example, rather than use continuous electrode structures 602, 604, 606, and 608 along the perimeter of resonator 610, as illustrated in FIG. 3A, MEMS device 304 of FIG. 5A may include partitioned electrodes 802, 804, 808, and 810 formed from groups of smaller electrode structures equidistant from a side of resonator 610. Each of the electrode structures in an individual partitioned electrode is coupled to the CMOS layers by conductive vias (not shown). Note that use of multiple smaller electrode structures of a partitioned electrode reduces the transduction of the MEMS device, which is contrary to typical MEMS device design goals. The number of smaller electrode structures in a partitioned electrode may be determined according to manufacturing design rules and based on specifications for sufficient transduction of MEMS device 304 for a target application. A CMOS circuit coupled to partitioned electrodes 802, 804, 808, and 810 is configured to apply a signal to resonator 610 or selected individual elements of the electrode structures and sense a capacitance between that individual element and the resonator 610. By sensing a current generated by the applied signal for each element of each of partitioned electrodes 802, 804, 808, and 810, variation in the gap between individual electrode elements and resonator 610 around MEMS device 304 may be determined. The partitioned electrodes provide higher resolution than a similar test using the continuous electrodes of FIG. 3A. The partitioned electrode technique of FIG. 5A may be used during one or more test stages (e.g., wafer probe, device testing, or other production test before or after packaging) to obtain higher resolution information, which may be used to determine manufacturing variations and/or identify defective devices.

Figure 5A:
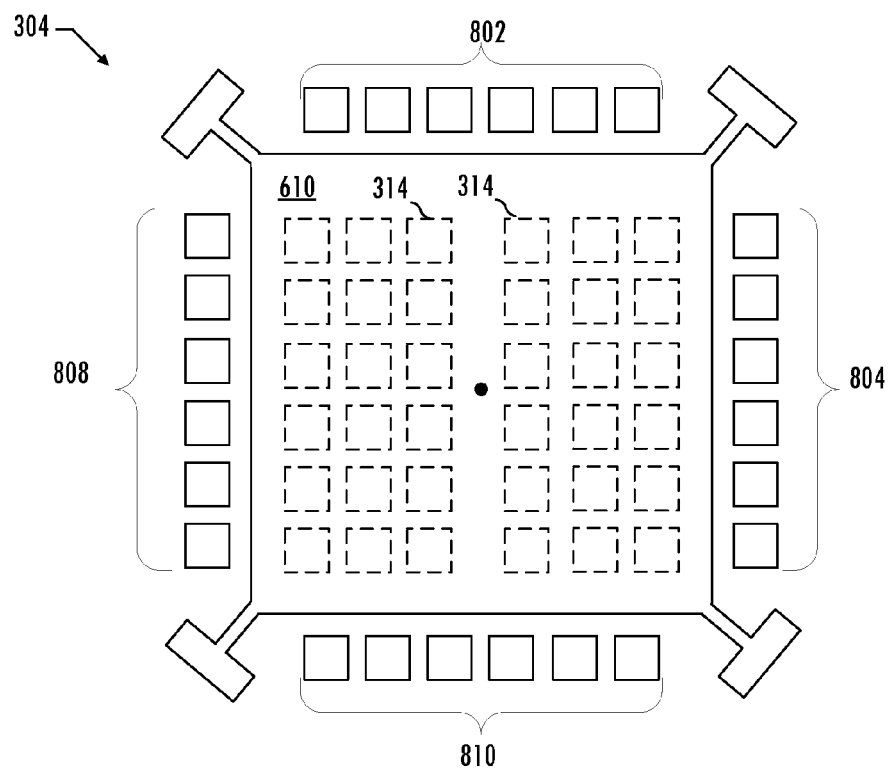
FIG. 5A illustrates a plan view of a MEMS device including partitioned electrodes consistent with at least one embodiment of the invention.
Figure 5B:
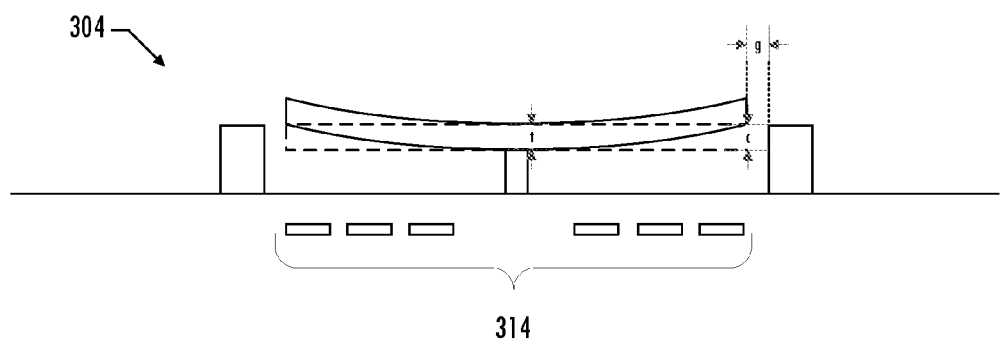
FIG. 5B illustrates a cross-sectional view of the MEMS device of FIG. 5A consistent with at least one embodiment of the invention.

Referring to FIGS. 4, 5A, and 5B, monitor structure 310 may be formed using resonator 610, which is formed using the MEMS structural layer, and conductive structures 314 formed underneath resonator 610. By measuring capacitance between individual conductive structures 314 and resonator 610 the curvature c may be determined. In at least one embodiment of a monitor structure, individual conductive structures 314 are formed in a two-dimensional array aligned underneath resonator 610 and spanning the area of resonator 610 in a conductive MEMS layer that corresponds to the two-dimensional geometry of resonator 610 formed above. In at least one embodiment of a monitor structure, individual conductive structures 314 are formed in conductive CMOS layers with corresponding openings in passivation layers formed between the conductive CMOS layers and MEMS layers. Note that structures 314 may have any suitable geometry. When unused for monitoring purposes (e.g., in a target mode of operation), individual conductive structures 314 are coupled to an appropriate power supply node (e.g., $V_{DD}$, $V_{SS}$, or other suitable reference node) to reduce or eliminate any unintended capacitive coupling.

Figure 6A:
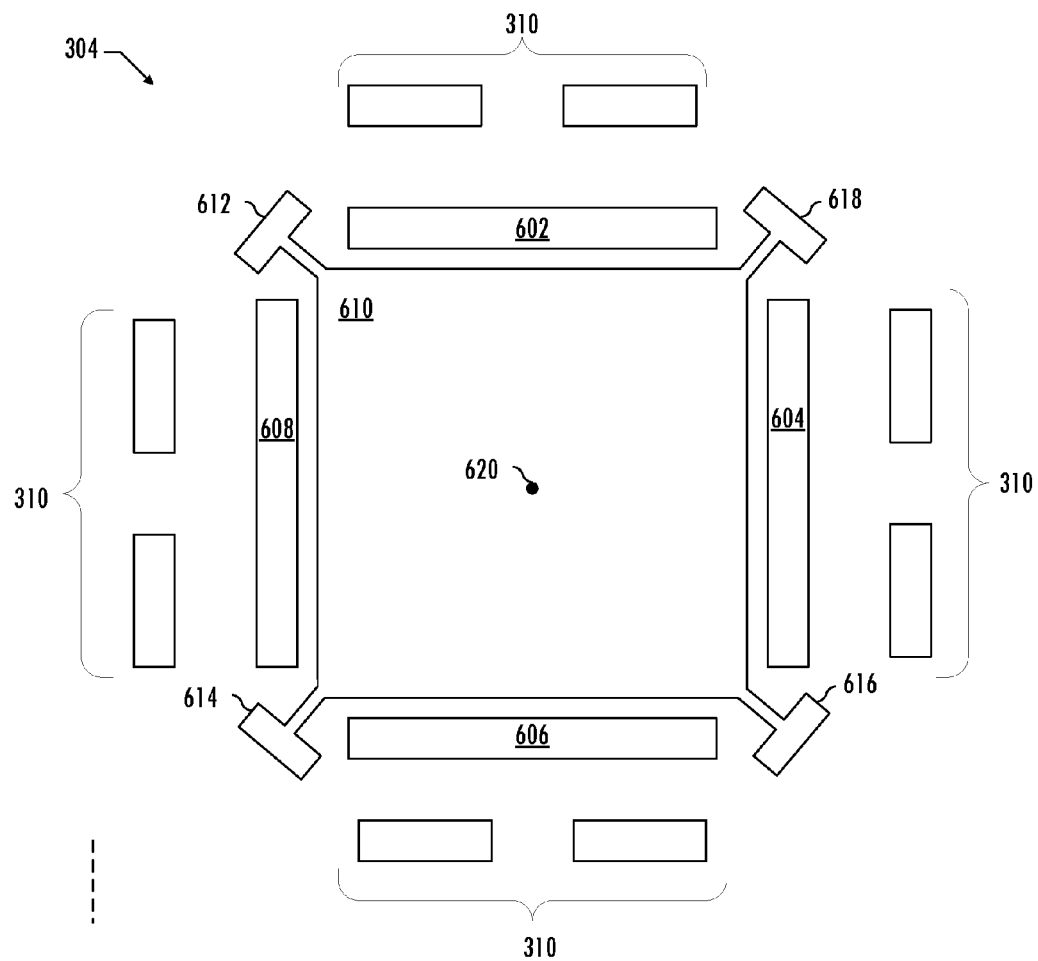
FIG. 6A illustrates a plan view of a MEMS device including a monitor structure formed in the MEMS structural layer consistent with at least one embodiment of the invention.
Figure 6B:
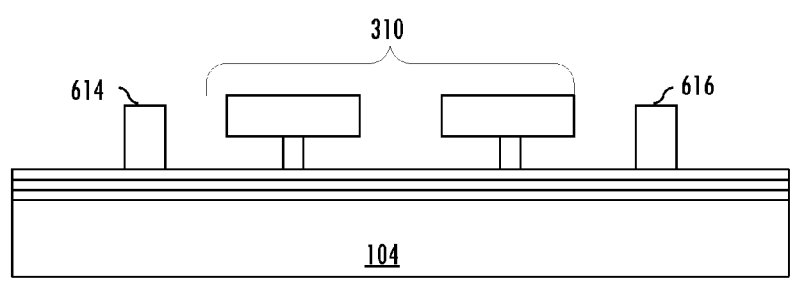
FIG. 6B illustrates a cross-sectional view of the MEMS device of FIG. 6A consistent with at least one embodiment of the invention.

Referring to FIGS. 6A and 6B, in at least one embodiment of a monitor structure 310, resistive structures are formed using a MEMS structural layer proximate to MEMS device 304. For example, resistive structures are formed parallel to the electrodes along the perimeter of the MEMS device. The resistance of those structures is a function of known widths of the structures (e.g., within a target range). For example, empirical measurements made during process development characterize the variation of photolithographically-defined geometries to set process tolerances. The actual physical values of those photolithographically-defined geometries are known to be within associated tolerances. Thus, accuracy of the known width is based on the variation of the width as dictated by the process divided by the drawn width (i.e., larger widths increase the accuracy). By measuring the resistance of the individual resistive structures 310, the thickness of the MEMS structural layer may be determined based on the conductivity of the material. In at least one embodiment of a MEMS device, since thickness of the MEMS structural layer is based on chemical-mechanical planarization (i.e., chemical-mechanical polishing or CMP), the thickness may not be as well-controlled as in-plane geometries defined by photolithographic techniques. However, by measuring the resistance of a resistor of known width, length, and resistivity, where resistance R=resistivity×length/(width×thickness), the thickness may be inferred. Note that a measurement of the capacitance of a capacitor constructed in the same layers, and having lengths and widths similar to those of the resistor, may be used to cancel local variations in photolithography. Since capacitance has a value C=permittivity×length×thickness/width, the ratio C/R isolates thickness. In this scheme, a known thickness is based on tolerances of resistivity and permittivity. When resistivity and permittivity are well-controlled the thickness may be inferred within a reasonable level of accuracy. Structure length and resistivity may be determined using similar techniques. When unused for monitoring purposes (e.g., in a target mode of operation), individual resistive structures 314 are coupled to an appropriate power supply node (e.g., $V_{DD}$, $V_{SS}$, or other suitable reference node) to reduce or eliminate any unintended capacitive coupling.

Figure 7:
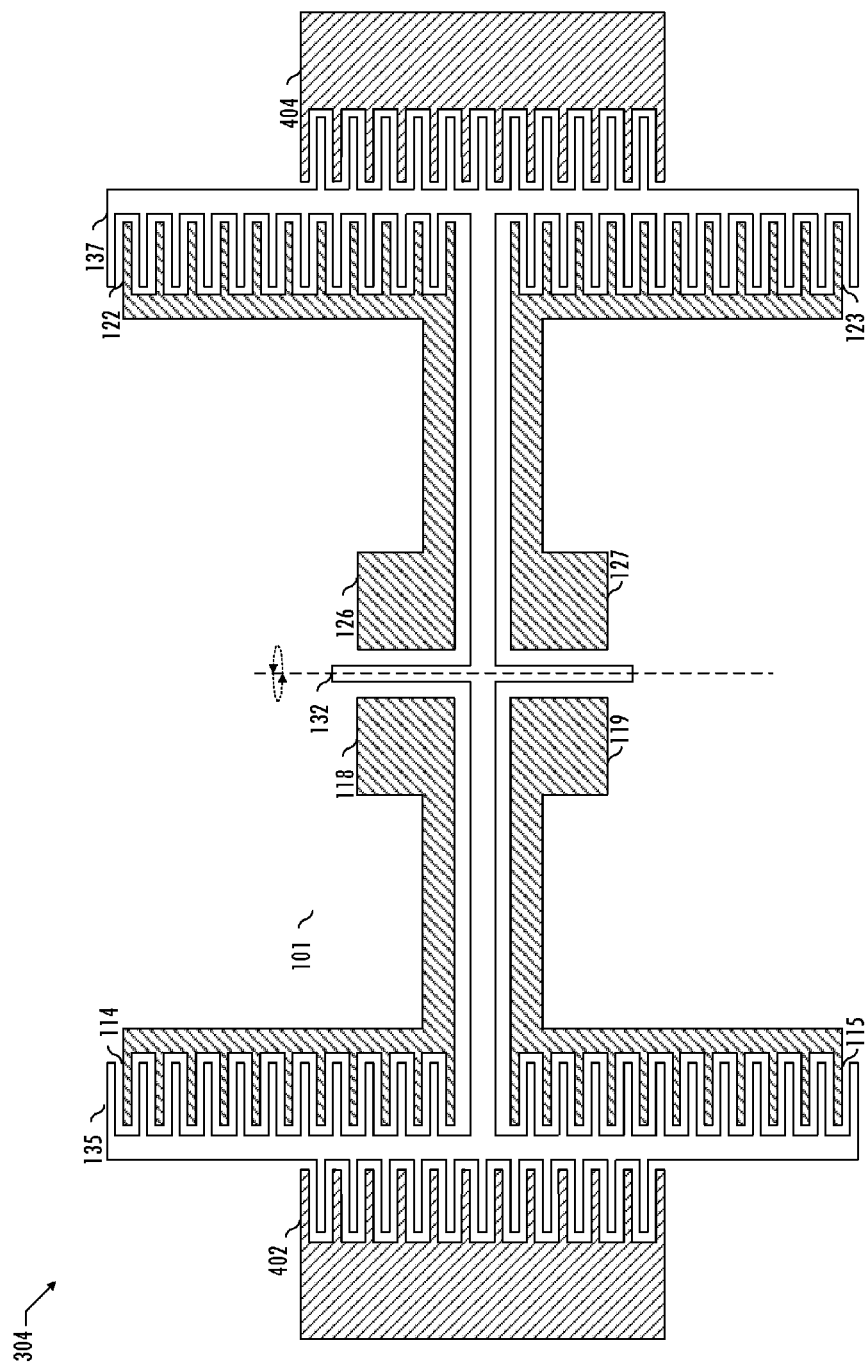
FIG. 7 illustrates a functional block diagram of a MEMS structure and associated monitor structure for detecting changes in capacitive transduction as a result of strain on the MEMS device consistent with at least one embodiment of the invention.

Referring to FIGS. 4 and 7, in at least one embodiment, monitor structure 310 includes one or more alternate MEMS electrodes for a MEMS device. In a typical MEMS device, the electrodes are anchored to the substrate at locations that reduce strain sensitivity of the MEMS device. For example, anchors 118, 119, 126, and 127, which are used in the normal operation of MEMS device 304, are located as close as possible to anchor(s) of central beam 132 to reduce strain sensitivity. However, to increase the precision of a strain measurement, monitor structure 310 includes alternate electrodes 402 and 404, which are formed in locations that increase the strain sensitivity of the MEMS device, e.g., at the farthest point from anchor(s) of central beam 132, and otherwise have the same electrical characteristics of the electrode including suspended capacitive fingers 114 and 115 and the electrode including suspended capacitive fingers 122 and 123, respectively, in the absence of strain on MEMS device 304. That is, alternate electrodes 402 and 404 are characterized by the same capacitive transduction gap in the absence of strain on MEMS device 304 by the electrode including suspended capacitive fingers 114 and 115 and the electrode including suspended capacitive fingers 122 and 123. Alternate electrodes 402 and 404 may be used in a characterization mode or a calibration mode and in that mode receive the same bias voltage as the electrode including suspended capacitive fingers 114 and 115 and the electrode including suspended capacitive fingers 122 and 123 in the normal operating mode. Alternate electrodes 402 and 404 may be included in a monitor structure 310 to sense strain for directly measuring the strain on MEMS device 304. In the normal mode of operation of MEMS device 304, alternate electrodes 402 and 404 are disabled, e.g., they are coupled to the same power plane as the resonator portion. Alternate electrodes 402 and 404 effectively apply a gain factor to the strain measurement increasing the resolution of the sensing technique. The ratio of strain sensitivity of the alternate electrodes to the less strain sensitive electrodes may be used to generate a strain compensation signal for the MEMS device to use in a normal mode of operation for a target application.

Figure 11:
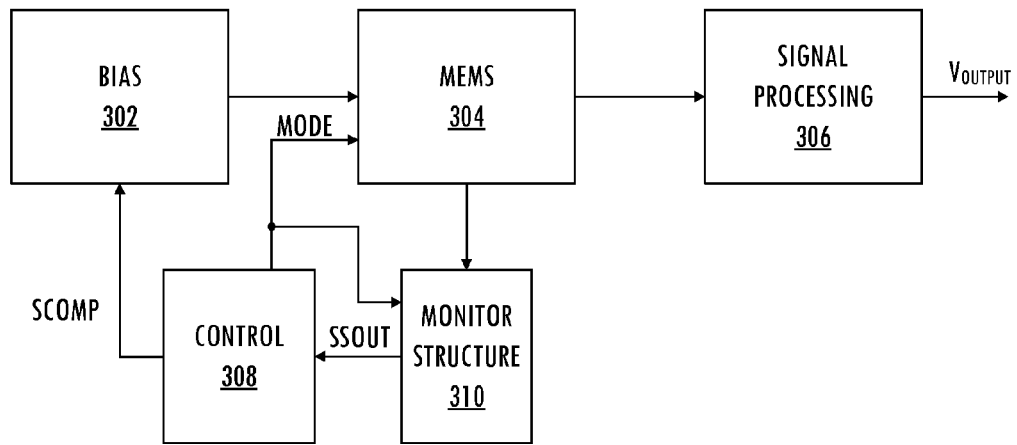
FIG. 11 illustrates a functional block diagram of a MEMS system configured for direct parameter sensing and compensation using a bias signal of the MEMS device consistent with at least one embodiment of the invention.
Figure 12:
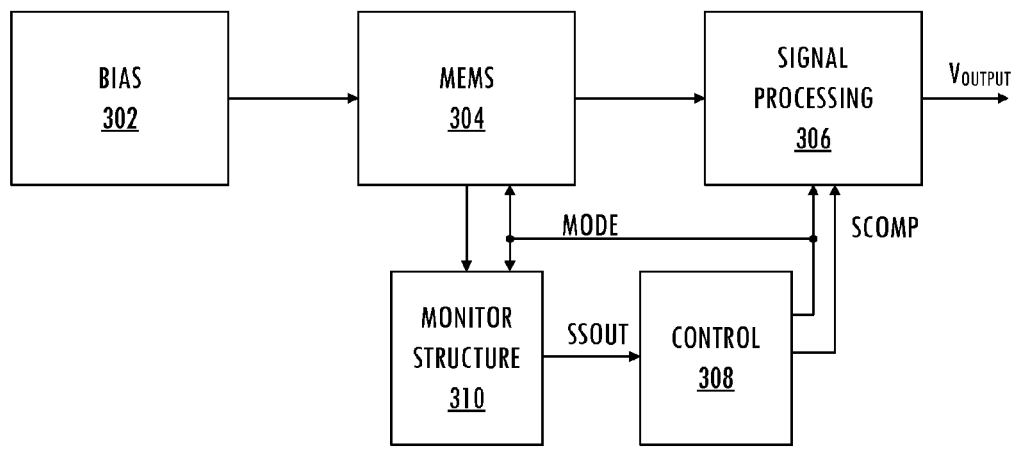
FIG. 12 illustrates a functional block diagram of a MEMS system configured for direct parameter sensing and compensation using signal processing of an output of the MEMS device consistent with at least one embodiment of the invention.
Figure 13:
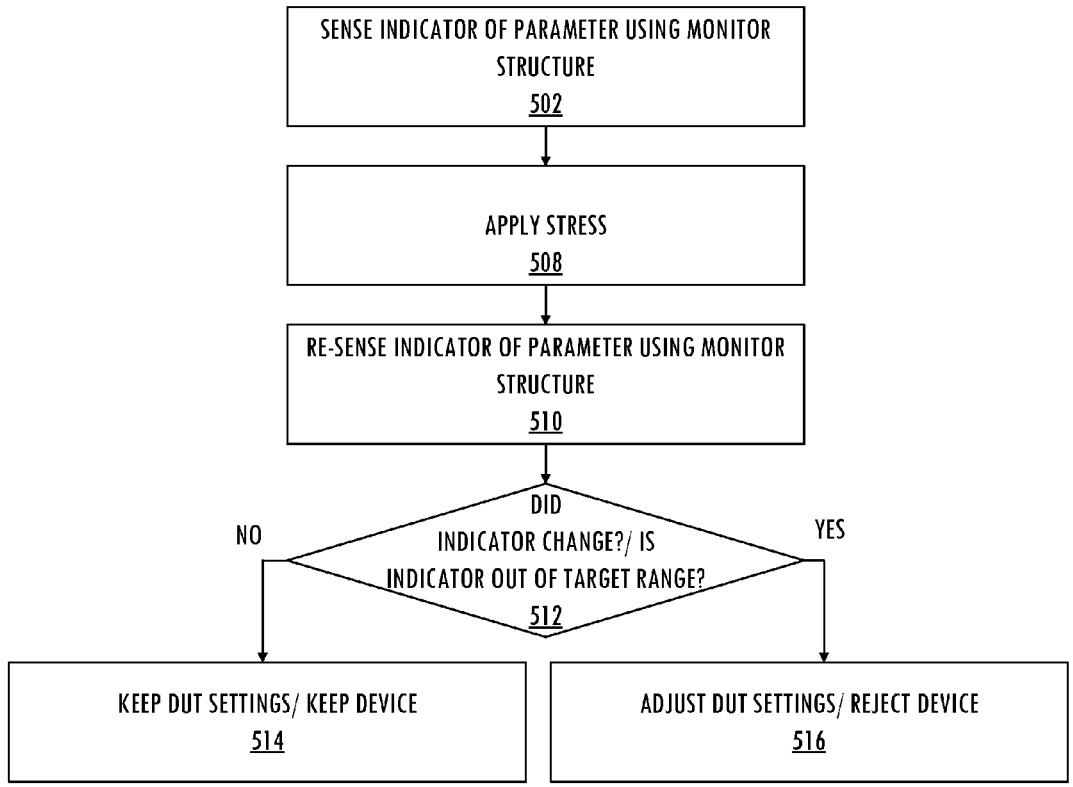
FIG. 13 illustrates information and control flows for characterizing and sorting manufactured MEMS devices based on variation in a device parameter of the manufactured MEMS devices consistent with at least one embodiment of the invention.

Referring to FIG. 8, in a typical MEMS system, MEMS device 304 may be configured using bias generator 302 and signal processing module 306 for particular application (e.g., as a sensor or actuator). Referring to FIGS. 9-12, techniques for in situ sensing of a device parameter and compensation of changes in capacitive transduction of MEMS device 304 resulting from the environmental factors include applying an electrical compensation signal to the MEMS system based on a signal indicative of a device parameter. In some embodiments of a MEMS system, the MEMS device itself receives the electrical compensating signal. Bias generator 302, signal processing module 306, and controller 308 may all be formed in CMOS circuit layers and monitor structure 310 may be any structure described above. Referring to FIGS. 9 and 11, MEMS bias generator 302 adjusts one or more bias signals that are applied directly to MEMS device 304 based on a compensation signal provided by controller 308 that is generated based on a signal indicative of the device parameter. In other embodiments of a MEMS system, an electrical compensation signal indirectly compensates for any variation from a target device parameter on the MEMS device by electrically compensating an output of the MEMS device or other signal generated based on the output of the MEMS device. For example, signal processing module 306, which is driven by the output of MEMS device 304, receives a compensation signal, SCOMP, and adjusts the output signal $V_{OUTPUT}$ based thereon, as illustrated in FIGS. 10 and 12. The compensation signal may be generated based on a signal indicative of the variation of the device parameter from a target device parameter on the MEMS device (SSOUT), which may be determined directly from MEMS device 304 by monitor structure 310, as illustrated in FIGS. 11 and 12, or indirectly determined by monitor structure 310 by sensing a device parameter on structures other than MEMS device 304, as illustrated in FIGS. 9 and 10. In addition, note that other embodiments of a MEMS system combine features of the MEMS systems of FIGS. 9-12 to use both direct and indirect sensing of device parameters on the MEMS device and/or compensation both to MEMS device 304 and signal processing module 306.

Referring back to FIGS. 9-12, controller 308 uses control signals (e.g., MODE) to configure one or more elements of the MEMS system in various modes of operation, e.g., a characterization mode before attaching the MEMS device to a substrate, a calibration mode after attaching the MEMS device to a substrate, and a compensation or normal operating mode. During a characterization mode of operation, monitor structure 310 senses a device parameter of the MEMS device. That sensed parameter or other indicator of an amount of compensation to be applied to MEMS device 304 may be stored for later use in another mode. Controller 308 may then configure the MEMS system in a normal operating mode that uses the predetermined device parameter value or predetermined device parameter compensation value to compensate for the variation from a target device parameter of MEMS device 304.

For example, referring to FIGS. 9-13, during a production test, test equipment interacts with the MEMS system to enable a characterization mode using any suitable integrated circuit interface (e.g., one or more pins of a serial or parallel data interface). In the characterization mode, the MEMS system uses monitor structure 310 to sense an indicator of the device parameter (502). Controller 308 generates a signal based on that indicator and provides it to the test equipment. Test equipment may then apply a stress to the MEMS device (508). Then test equipment may again configure the MEMS system in the characterization mode to sense the indicator of the device parameter after application of the stress (510). If the device parameter has not changed or stayed within a target range (512), the test equipment identifies MEMS device 304 as meeting the specification and/or as a viable product (514). However if the device parameter has changed and/or is out of a target range, the test equipment adjusts the device settings and/or rejects the device as being out of specification (516).

Figure 14:
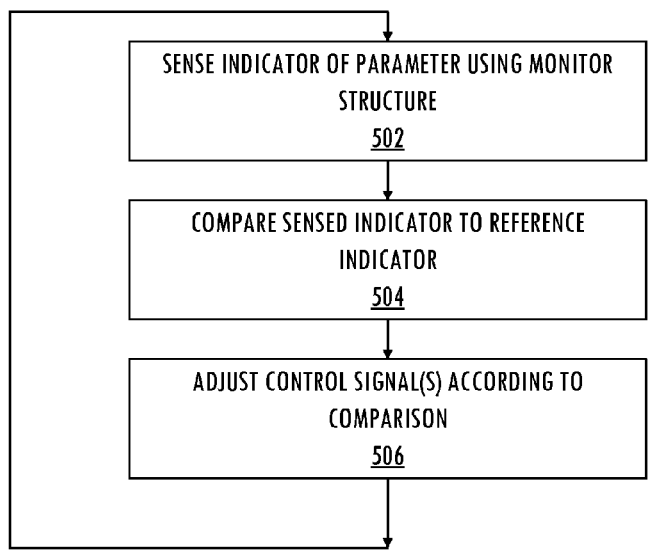
FIG. 14 illustrates information and control flows for continuous time in situ characterization and calibration of manufactured MEMS devices consistent with at least one embodiment of the invention.

Referring to FIG. 14, an exemplary in situ calibration technique senses an indicator for the device parameter using monitor structure 310 (502). Control circuitry 308 compares the sensed indicator to a reference indicator (504). Controller 308 then adjusts MEMS control signals according to the comparison (506). Controller 308 may continually monitor the device parameter and update the control signals during normal MEMS operation. During a characterization mode of a production test, the control circuitry may continually monitor the device parameter and update control signals until a test time has completed. The resulting control signals may be stored for later use during normal operation.

Figure 15:
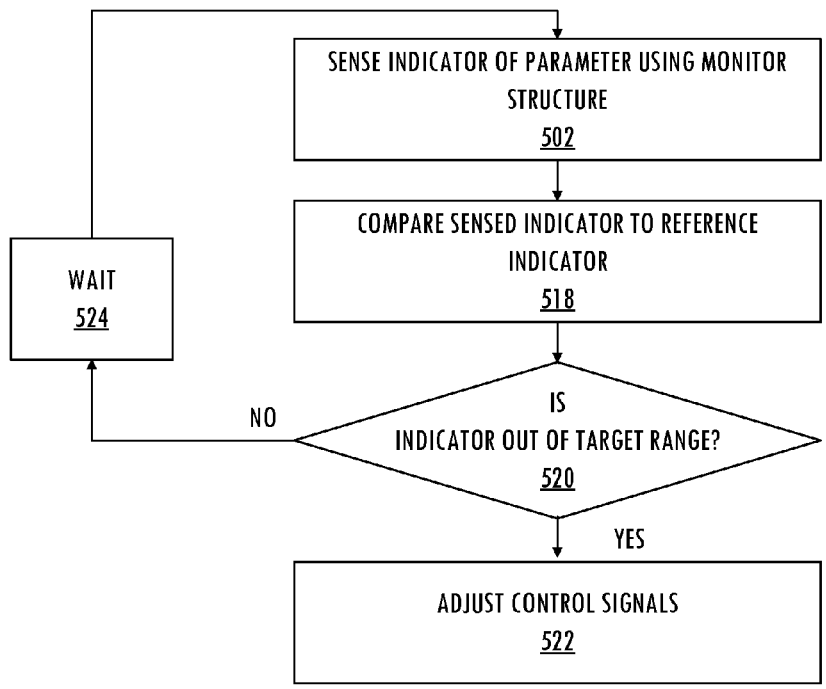
FIG. 15 illustrates information and control flows for discrete time in situ characterization and calibration of manufactured MEMS devices consistent with at least one embodiment of the invention.

Referring to FIG. 15, another exemplary in situ calibration technique senses an indicator for the device parameter using monitor structure 310 (502). Controller 308 compares the sensed indicator to a reference indicator (518). Controller 308 then determines whether the sensed indicator is out of a target range based on the comparison (520). If so, controller 308 adjusts the control signals (522). If the indicator is outside of a target range, then the control circuit waits a predetermined amount of time (524) before sensing the indicator again (502). During a characterization mode of a production test, the control circuitry may repeat monitoring the device parameter and update control signals until a test time has completed. The resulting control signals may be stored for later use during normal operation.

In other embodiments of a MEMS system, additional measurements of device parameters are made and stored for later use and/or applied during normal system operation. For example, a parameter may be sensed during a wafer-level probe test, the parameter may be sensed after packaging, and/or the parameter may be sensed after board assembly. Those measurements may be used by controller 308 to generate a compensation signal during a compensation mode or normal operating mode. Such techniques may reduce testing costs, and allow a MEMS manufacturer to deliver calibrated MEMS devices to customers. In addition, controller 308 may repeat parameter measurement periodically during the target application (i.e., a compensation mode) and update the compensation signal accordingly. By measuring the parameter during compensation mode and updating the compensation signal, the system compensates for any changes in the device parameter due to aging (e.g., relaxation of a MEMS package after being attached to a printed circuit board).

Figure 16:
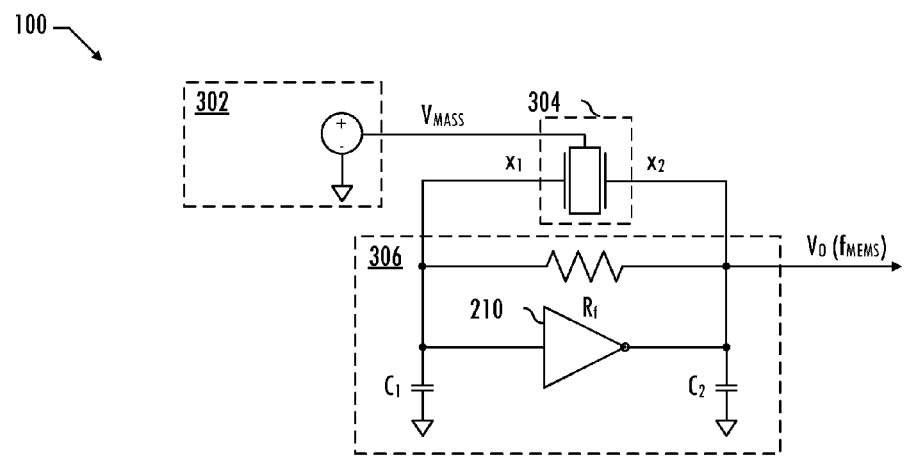
FIG. 16 illustrates a circuit diagram of a MEMS device configured as an oscillator.

Referring to FIGS. 7, 11, and 12, in at least one embodiment, a MEMS system determines variation of a parameter (e.g., resonant frequency variation) with respect to strain based on a differential measurement of the parameter with respect to strain. For example, controller 308 configures MEMS device 304 as a resonator. Referring to FIG. 16, sense electrode $x_1$ generates a signal based on energy transfer from a vibrating mass of MEMS device 304, thereby converting mechanical energy into an electrical signal. In general, bias signals added at various points of a circuit determine an operating point of the circuit and may be predetermined, fixed DC voltages or currents added to AC signals. MEMS device 304 receives a mass-to-electrode bias voltage, which may be established by applying voltages to the mass and/or electrode. For example, the mass of MEMS device 304 receives a DC bias voltage, $V_{MASS}$, which is generated by a precision voltage reference or voltage regulator of bias generator 302. In other embodiments of a MEMS system, an electrode receives a suitable DC bias voltage and the mass is coupled to a ground voltage or both the electrode and the mass receive DC bias voltages that result in the target mass-to-electrode bias voltage. A large feedback resistor ($R_F$) biases amplifier 210 in a linear region of operation, thereby causing amplifier 210 to operate as a high-gain inverting amplifier. Vibrations of MEMS device 304 are sustained by feeding back the output of amplifier 210 to a drive electrode of MEMS device 304. Amplifier 210 receives a small-signal voltage from sense electrode $x_1$ and generates a voltage on drive electrode $x_2$ that causes the mass of MEMS device 304 to continue to vibrate. MEMS device 304 in combination with capacitances $C_1$ and $C_2$ form a pi-network band-pass filter that provides 180 degrees of phase shift and a voltage gain from drive electrode $x_2$ to sense electrode $x_1$ at approximately the resonant frequency of MEMS device 304.

Referring to FIGS. 7, 11, 12, and 16, MEMS device 304 uses the electrode including suspended capacitive fingers 114 and 115 and the electrode including suspended capacitive fingers 122 and 123, and measures and stores a first indicator of the MEMS resonant frequency. Then, controller 308 configures MEMS device 304 as a resonator using alternate electrodes 402 and 404 and measures and stores a second indicator of the resonant frequency. Controller 308 uses the first and second indicators of resonant frequency along with the ratio of strain sensitivity of the alternate electrodes to the less strain sensitive electrodes to generate a differential measurement of frequency variation with respect to strain only. Controller 308 then uses that differential measurement to reduce or eliminate any impact of other environmental factors on the strain measurement and compensation signal. In addition, note that in other embodiments, rather than measuring and/or adjusting the resonant frequency of a MEMS device, other parameters may be measured and/or adjusted. For example, techniques described herein may be applied to offset cancellation in inertial sensors by measuring a capacitive modulation voltage, or other suitable sensor output, using a first measurement made using first electrodes and a second measurement made using second electrodes that are more strain-sensitive than the first electrodes.

Regardless of which device parameter is being sensed, it is generally the same as the parameter that is being compensated, but with an amplification or scale factor (e.g., ratio of strain sensitivity of the different sets of electrodes). The scale factor may be determined prior to assembly on a product board (e.g., by applying thermal stress through integrated heaters on the package of the MEMS device or other suitable technique) and then stored in memory in the integrated circuit of the MEMS device and used to compensate for subtle variations of the target parameter. Note that the lower the strain sensitivity of the parameter and the greater the scale factor, the less sensitive the compensation technique is to process variations or tolerances of the scale factor. The scale factor may also be determined as the MEMS device or packaged MEMS device is exposed to strain variations. For example, by comparing the parameter measured during a first mode of operating the MEMS device and the parameter measured during a second mode of operating the MEMS device to the parameter measurements during those modes of operation for a known, stable reference, e.g., another oscillator that is known to be stable, the differential measurements can be interpolated to determine the scale factor, which is used to generate compensation signals.

Figure 17:
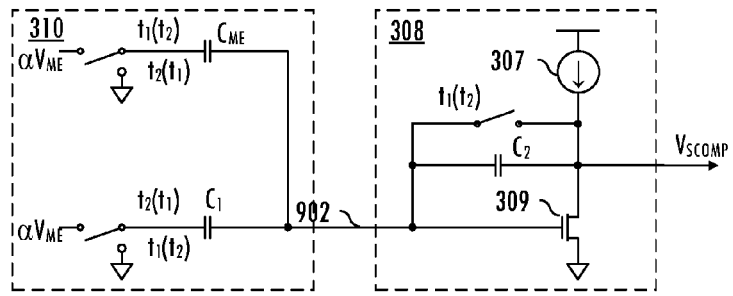
FIG. 17 illustrates a circuit diagram of an exemplary strain sensor and control circuit of FIGS. 9 and 10 consistent with at least one embodiment of the invention.

Referring to FIG. 17, in at least one embodiment, monitor structure 310 includes a strain insensitive capacitor and compares the capacitance between the resonator and electrode, $C_{ME}$, of MEMS device 304, to the capacitance of the strain insensitive capacitor and provides a voltage to controller 308, which generates a compensation voltage, $V_{SCOMP}$, based on the comparison. In calibration mode, i.e., $t_1$, the capacitor between MEMS device 304 and an electrode, $C_{RE}$, receives a first voltage, i.e., $\alpha V_{ME}$, and the strain-insensitive capacitor is coupled to ground. Accordingly, node 902 will charge to the voltage $\alpha V_{ME} \times C_{ME}/(C_{ME}+C_1)$, which equals $\alpha V_{ME}/2$, when there is no strain (i.e., $C_1=C_{ME}$), where $\alpha$ is a scaling factor. In calibration mode, capacitor $C_2$ is bypassed, device 309 is diode-coupled, and current source 307 charges the gate-to-source capacitance of device 309 to $V_{GS}$. Device 309 is configured to provide flicker compensation on the input of the charge pump in normal operation.

Still referring to FIG. 17, in normal operation, i.e., $t_2$, node 309, which was precharged to $V_{GS}+\alpha V_{ME} \times C_{ME}/(C_{ME} \pm C_1)$, is additionally charged or discharged by an amount equal to the difference between $C_{ME}$ and $C_1$ (assuming $C_1=C_2$). Thus the output node has a voltage of:

$$V_{SCOMP}(t_2) = V_{GS} \pm \frac{\alpha V_{ME}(C_{ME} - C_1)}{C_2}.$$

Since $C_1$ and $C_2$ have stress-invariant values matched to $C_{ME}$, then $$V_{SCOMP}(t_2) \approx V_{GS} \pm \alpha V_{ME}\left(\frac{\Delta C_{ME}}{C_{ME}}\right).$$

Note that although the capacitors $C_1$ and $C_2$ may be designed to have the same capacitance as $C_{ME}$, in other embodiments, due to headroom constraints on $C_2$, $C_2$ has a predetermined value greater than $C_{ME}$. Monitor structure 310 and controller 308 may include provisions for trimming $C_1$ and $C_2$ to match or have a predetermined relationship to $C_{ME}$. For example, non-volatile memory bits may be included to selectively enable one or more additional capacitances of $C_1$ and/or $C_2$ to match $C_{RE}$. Gain scaling features may include inversion of the control signal phases $t_1$ and $t_2$ to change the sign of the output signal and input voltage scaling for magnitude by using least-significant bits for $\alpha$. Note that the circuit structure of monitor structure 310 and controller 308 of FIG. 17 is exemplary only and various other circuit configurations may be used to detect the change in capacitive transduction of MEMS device 304 and generate a corresponding strain compensating signal.

In at least one embodiment, rather than using actual or strain-sensitive electrodes of the MEMS device having a capacitance $C_{ME}$, a separate strain-sensitive capacitor formed in the integrated circuit substrate and having a capacitance of $C_{ME}$ may be used along with strain insensitive capacitors $C_1$ and $C_2$ of monitor structure 310 and controller 308 of FIG. 17. In at least one embodiment, rather than using strain sensitive capacitors and strain insensitive capacitors $C_1$ and $C_2$, monitor structure 310 and controller 308 of FIG. 17 may be adapted for a strain sensitive resistor or transistor and strain insensitive resistors o transistors, respectively, formed on the substrate. Alternate embodiments of controller 308 may exclude the flicker compensation features (e.g., current source 307 and device 309) and generate an output signal $V_{SCOMP}$ of $$V_{SCOMP}(\phi_2) = \pm \frac{\alpha V_{RE}(C_{RE} - C_1)}{C_2} \approx \pm \alpha V_{RE}\left(\frac{\Delta C_{RE}}{C_{RE}}\right).$$

The compensation signal is provided to signal processing module 306, which applies strain compensation to the MEMS system. In yet another embodiment, monitor structure 310 of FIG. 17 may be adapted for comparing the $C_{RE}$ of MEMS device 304 to $C_{RE2}$ of an auxiliary MEMS device of monitor structure 310.

Figure 18:
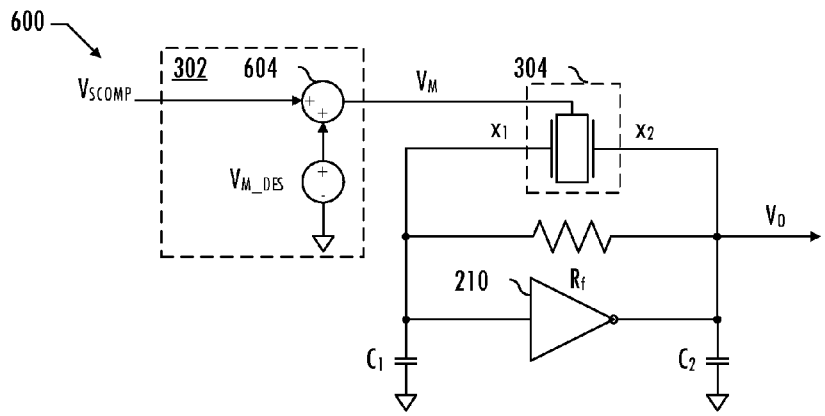
FIG. 18 illustrates a circuit diagram of an exemplary MEMS oscillator responsive to a strain-compensating bias signal of FIGS. 9 and 11 consistent with at least one embodiment of the invention.
Figure 19:
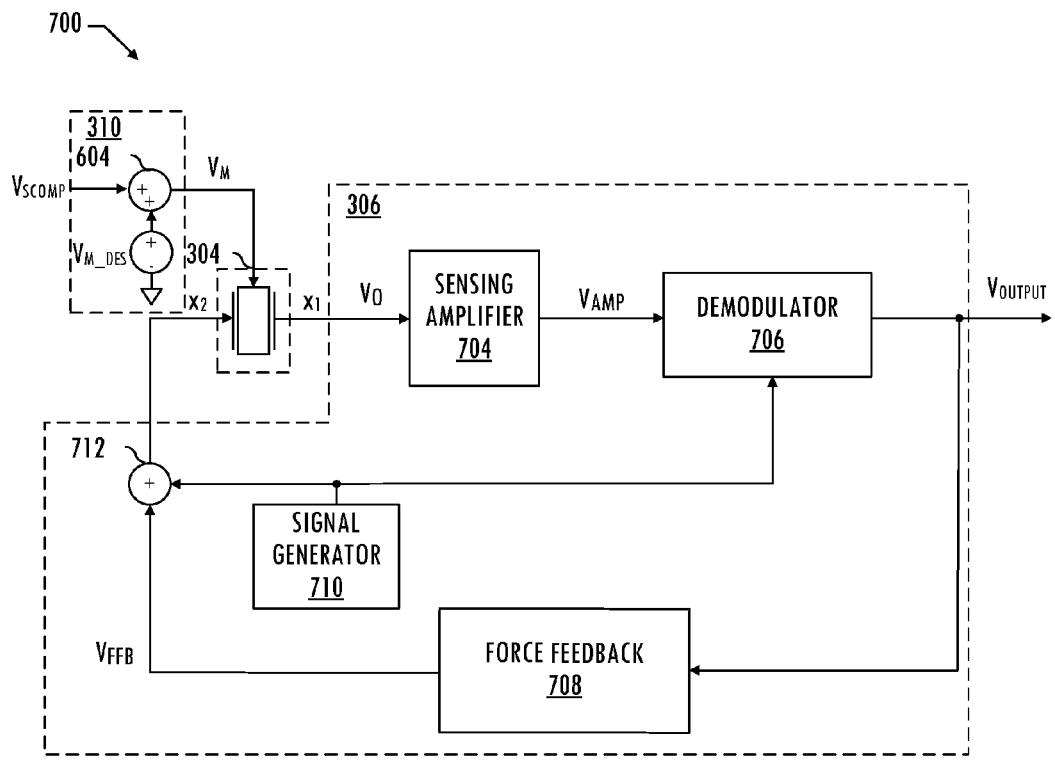
FIG. 19 illustrates a circuit diagram of an exemplary MEMS sensor responsive to a compensating bias signal consistent with at least one embodiment of the invention.

Referring back to FIGS. 9 and 11, controller 308 may provide an output signal, $V_{SCOMP}$, which may be generated using techniques described above or based on digital techniques (described below), to bias generator 302. Referring to FIGS. 18 and 19, bias generator 302 may include a summing module that generates a bias voltage provided to the mass of MEMS device 304, whether MEMS device 304 is configured as a resonator (e.g., FIG. 18) or configured as a sensor using sensing amplifier 704, demodulator 706, signal generator 710, summing node 712, and force feedback generator 708 (e.g., FIG. 19). Since target DC bias voltages applied to the mass may be greater than the power supply voltage (e.g., mass bias voltages of 3V or higher), summing module 604 may be implemented using charge pump techniques to combine the target mass bias voltage with a strain-compensating voltage.

Figure 20:
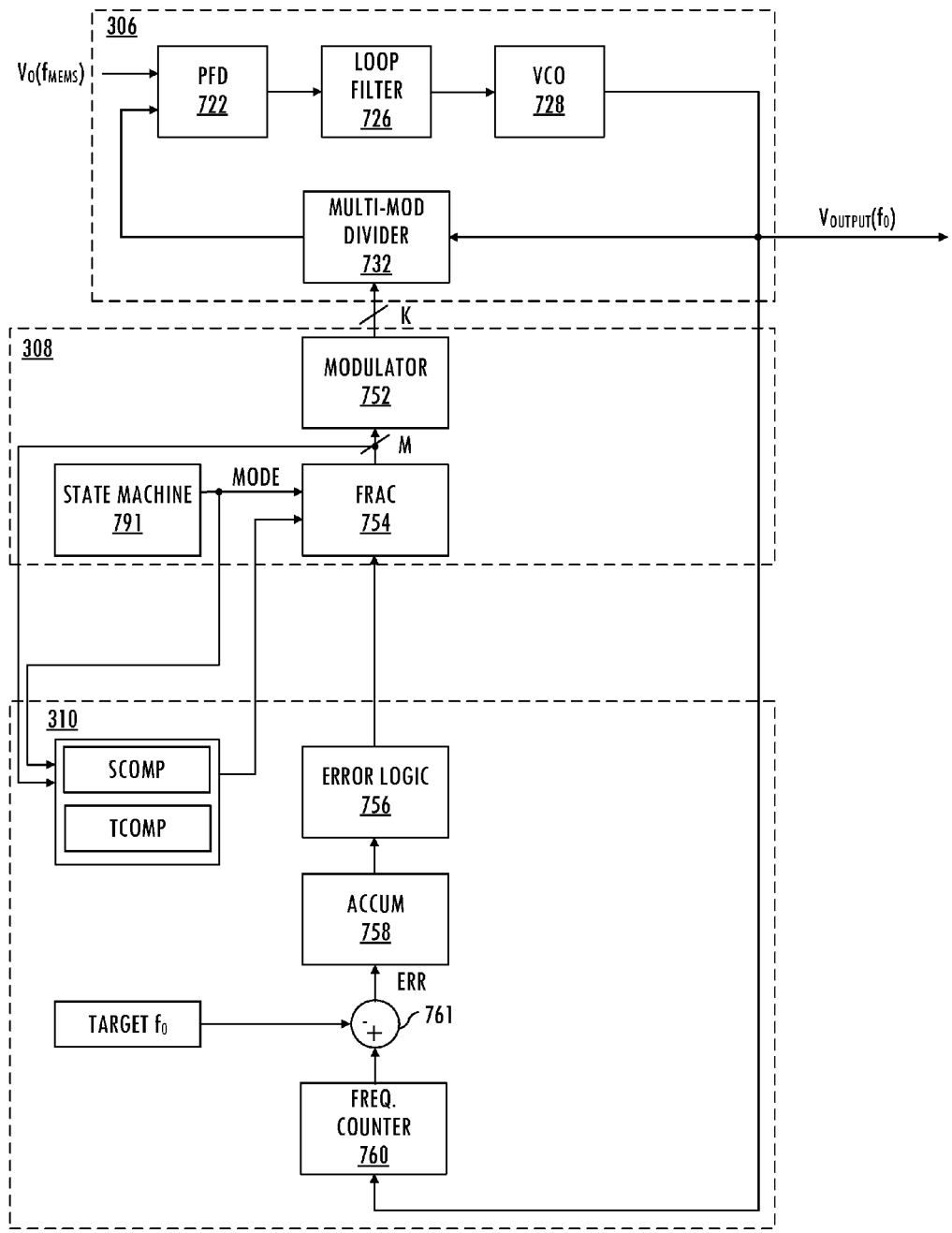
FIG. 20 illustrates a functional block diagram of an exemplary signal processing module responsive to a compensation control signal of FIGS. 10 and 12 consistent with at least one embodiment of the invention.

Referring to FIG. 20, in at least one embodiment, a MEMS system uses digital techniques to detect a change in resonant frequency of a MEMS device configured as a resonator. Regardless of how monitor structure 310 detects the strain that causes a change in the resonant frequency, the strain indicator or change in resonant frequency may be digitized. Controller 308 provides an indication of the change in resonant frequency to a phase-locked loop (PLL) or frequency-locked loop (FLL) of signal processing module 306 to compensate for the effects of strain on the resonant frequency. The PLL or FLL of signal processing module 306 generates a reference clock signal, $V_{OUTPUT}$, having a frequency $f_o$ that matches a resonant frequency of MEMS device 304 based on the output of MEMS device 304. An exemplary PLL includes phase detector (PFD) 722, loop filter 726, voltage-controlled oscillator (VCO) 728, and divider 732.

During the calibration mode, state machine 791 configures control module 208 to determine one or more control settings for use in the normal mode. Those control settings will be used in the normal mode to generate an output signal, $V_{OUTPUT}$, having a frequency that matches a target resonant frequency of the MEMS device, thereby compensating for effects of strain on the resonant frequency of MEMS device 304. For example, signal processing module 306 uses those control signals to lock the frequency of VCO 728 of a fractional-N phase-locked loop to generate an oscillating signal having a frequency that is the predetermined resonant frequency of the MEMS device (e.g., resonant frequency measured prior to introduction of strain on the device) or target for the resonant frequency of MEMS device 304. During the calibration mode ($t_1$), another control loop adjusts an M-bit fractional divider value that is stored in FRAC 754 and is updated until the output of VCO 728 is equal to the target resonant frequency or other predetermined resonant frequency (e.g., resonant frequency of the MEMS device when configured in characterization mode ($t_0$)). The final value in FRAC 754 is stored in SCOMP for later use in normal mode ($t_2$).

In at least one embodiment of monitor structure 310, which includes the digital logic that determines the difference in resonant frequency resulting from strain, frequency counter 760 counts event frequency of the signal generated by VCO 728. Digital circuit 761 subtracts the target event frequency from the output of frequency counter 760 and provides the difference to accumulator 758. When those event frequencies match, the output error provided to accumulator 758 is approximately zero. Otherwise a non-zero error signal indicates the frequency error, which is provided to accumulator 758. Error logic 756 uses an accumulated error signal to generate a fractional divide value that is used by the phase-locked loop to adjust the frequency of the output of VCO 728 to lock to the target resonant frequency. In at least one embodiment of the calibration mode, signal processing module 306 also implements an open-loop temperature compensation technique that determines and stores temperature coefficients. Those predetermined temperature coefficients may be applied to the fractional divider value stored in FRAC 754 or other system parameters used in the normal mode to generate the output signal having a frequency matched to the target or pre-strain resonant frequency.

At the end of the calibration mode, which is long enough for the PLL of signal processing module 306 to lock $V_{OUTPUT}$ to the target resonant frequency, one or more associated control signals are stored for later use during the normal mode of operation. For example, FRAC 754 stores an M-bit fractional divider value. During normal mode, the contents of FRAC 754 are not updated or are loaded from SCOMP and that predetermined M-bit fractional divider value is provided to delta-sigma modulator 752, which provides a stream of K-bit divide values (where K<M) to multi-modulus divider 732 to implement an effective divide value that approximates the stored fractional divider value. As a result, in normal operating mode, VCO 728 generates a signal having a frequency that achieves the target resonant frequency of MEMS device 304. Note that the digital logic of FIG. 20 is exemplary only and various other PLL and digital logic configurations for sensing a change in resonant frequency and using a PLL to compensate for the shift in resonant frequency due to variation in device parameters may be used.

Figure 21:
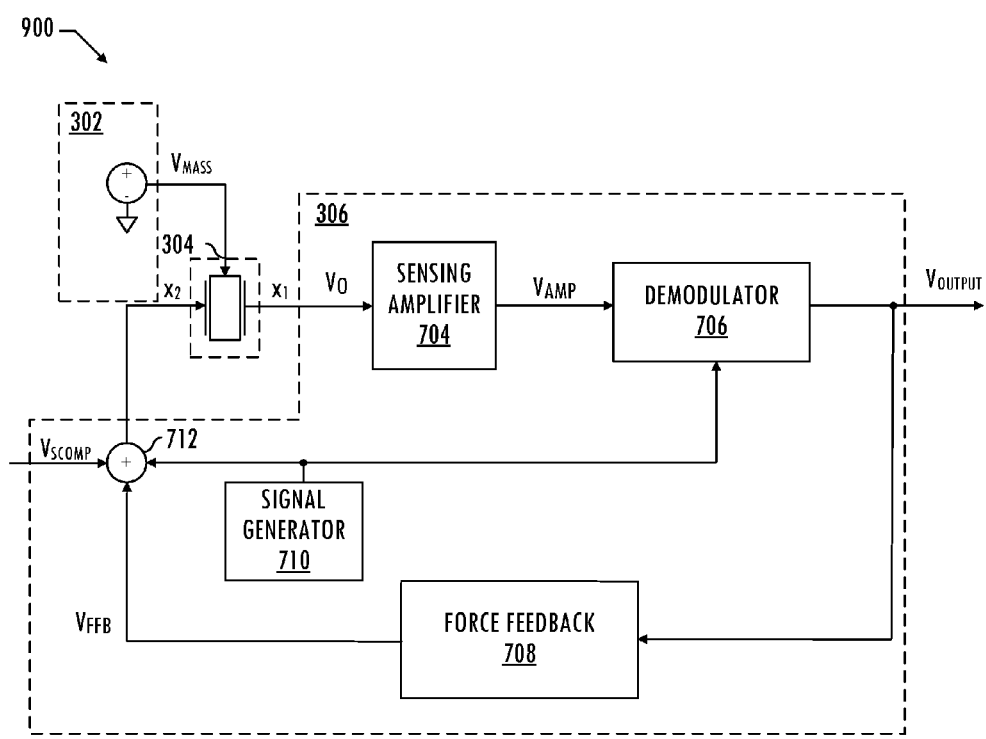
FIG. 21 illustrates a functional block diagram of an exemplary MEMS sensor responsive to a compensating force feedback signal consistent with at least one embodiment of the invention.

Referring to FIG. 21, in a typical sensor application, a strain compensation signal determined using techniques described above may be applied to a summing node of a sensor implemented using a force feedback technique. The technique applies a feedback force to drive electrode $x_2$ to keep the mass at its equilibrium position (i.e., no displacement). The feedback control signal $V_{FFB}$ is generated based on sensed displacements of the mass with respect to a frame (e.g., substrate) of MEMS device 104. In at least one embodiment of force feedback module 708, the feedback control signal, $V_{FFB}$, maintains the mass of MEMS device 304 in its equilibrium position to reduce or eliminate occurrence of non-linear behavior of the mass movement as compared to a MEMS system without force feedback. Since the apparent acceleration of the mass is based on the force-feedback signal applied to the drive electrode given the DC bias applied to the mass, strain or variation in other device parameter may change the apparent acceleration and sensed displacement of the MEMS device, resulting in a less accurate sensor. However, by incorporating strain sensing techniques described above into the sensor system, those inaccuracies can be reduced or eliminated. For example, the strain compensation signal $V_{SCOMP}$ is summed with a force feedback voltage level $V_{FFB}$ by summing module 712. Summing module 712 provides the summed signal to an electrode of MEMS device 304. Accordingly, the apparent acceleration of MEMS device 100 is unchanged by strain on MEMS device 304. Similarly, techniques described herein may be adapted to compensate for variation in other device parameters, other MEMS systems, and/or other applications.

The various monitor structures described above may be used to extract indicators of device parameters of interest (e.g., geometrical parameters including thickness, curling, gap, etc. and mechanical parameters including Young's modulus, material density, yield strength, cavity partial pressure, strain, etc.). The techniques described herein may be used to identify MEMS devices that have been manufactured with device parameters within target ranges, and provide additional information about those MEMS devices having defects. In addition techniques described herein may be used in a compensation mode, i.e., the MEMS system is configured for a target application and the MEMS device is compensated for sensed device parameters that are outside of target specification ranges to improve performance of the MEMS system. The description of the invention set forth herein is illustrative, and is not intended to limit the scope of the invention as set forth in the following claims. For example, while the invention has been described in embodiment using a resonant plate, one of skill in the art will appreciate that the teachings herein can be utilized by MEMS devices having other geometries. Variations and modifications of the embodiments disclosed herein, may be made based on the description set forth herein, without departing from the scope and spirit of the invention as set forth in the following claims.

What is claimed is:

1. A method of operating a system including a microelectromechanical system (MEMS) device of an integrated circuit die comprising:
    generating an indicator of a device parameter of the MEMS device in a first mode of operating the system using a monitor structure formed using a MEMS structural layer of the integrated circuit die; and
    generating, using a complementary metal-oxide semiconductor (CMOS) device of the integrated circuit die, a signal indicative of the device parameter and based on the indicator.

2. The method, as recited in claim 1, wherein the device parameter is a geometric dimension of the MEMS device.

3. The method, as recited in claim 1, further comprising:
    in a second mode of operating the system, compensating for a difference between a value of the signal and a target value of the signal.

4. The method, as recited in claim 1, further comprising:
    re-generating the indicator after exposing the MEMS device to stress; and
    generating a second signal indicating a change in the device parameter.

5. The method, as recited in claim 1, further comprising:
    rejecting the integrated circuit die in response to the signal indicating the parameter falls outside of a predetermined range for the device parameter.

6. The method, as recited in claim 1, further comprising:
    receiving a control value based on the signal; and
    operating the system in a second mode of operation based on the control signal.

7. The method, as recited in claim 6, further comprising:
    communicating the signal externally from the integrated circuit die, wherein the control value is received by the integrated circuit die from an external circuit.

8. The method, as recited in claim 6, further comprising:
    communicating the signal to a control circuit formed using CMOS layers of the integrated circuit die; and
    generating the control value by the control circuit, the control value being received from the control circuit.

9. The method, as recited in claim 8, wherein the control circuit uses the signal to determine whether the device parameter is within a predetermined range of device parameter values.

10. The method, as recited in claim 1, wherein generating the indicator comprises:
generating the first indicator of the device parameter of the MEMS device using the monitor structure prior to attaching a substrate including the MEMS device to a second substrate; and
generating a second indicator of the device parameter of the MEMS device using the monitor structure after attaching the substrate including the MEMS device to the second substrate.

11. The method, as recited in claim 1, wherein generating the indicator comprises:
comparing a first output of a parameter-sensitive device to a second output of a parameter insensitive device and generating an indicator thereof, wherein the monitor structure includes the parameter-sensitive device and the parameter-insensitive device.

12. A MEMS device manufactured by the method, as recited in claim 1.

13. An integrated circuit die comprising:
a microelectromechanical system (MEMS) device formed using a MEMS structural layer of the integrated circuit die,
a monitor structure configured to generate an indicator of a device parameter of the MEMS device, the monitor structure being formed using the MEMS structural layer; and
a complementary metal-oxide semiconductor (CMOS) circuit configured to generate a signal indicative of the device parameter based on the indicator, the signal being generated in a first mode of operation of the integrated circuit.

14. The integrated circuit die, as recited in claim 13, wherein the monitor structure is formed using a portion of the MEMS device.

15. The integrated circuit die, as recited in claim 13, further comprising:
a control circuit configured to provide a compensating signal to the MEMS device based on the signal in a second mode of operation of the integrated circuit.

16. The integrated circuit die, as recited in claim 13, wherein the monitor structure includes a capacitor or resistor formed using the MEMS structural layer.

17. An integrated circuit die comprising:
a microelectromechanical system (MEMS) device formed using a MEMS structural layer of the integrated circuit die,
a monitor structure configured to generate an indicator of a device parameter of the MEMS device; and
a complementary metal-oxide semiconductor (CMOS) circuit configured to generate a signal indicative of the device parameter based on the indicator, the signal being generated in a first mode of operation of the integrated circuit,
wherein the monitor structure includes a partitioned electrode of the MEMS device.

18. The integrated circuit die, as recited in claim 13, wherein the monitor structure includes an auxiliary MEMS device.

19. The integrated circuit die, as recited in claim 18, wherein the MEMS device is configured to resonate in-plane and the auxiliary MEMS device is configured to resonate out-of-plane.

20. The integrated circuit die, as recited in claim 13, wherein the monitor structure includes a conductive portion configured to form a capacitor with a portion of the MEMS structural layer using a conductive layer formed beneath the MEMS structural layer.

21. A method of manufacturing an apparatus comprising:
forming a microelectromechanical system (MEMS) device using a MEMS structural layer of the integrated circuit die; and
forming a monitor structure using the MEMS structural layer of the integrated circuit die, the monitor structure being configured to generate an indicator of a device parameter of the MEMS device; and
forming a complementary metal-oxide semiconductor (CMOS) circuit configured to generate a signal indicative of the device parameter in a first mode of operation of the integrated circuit.

* * * * *